United States Patent [19]

Slotboom et al.

[11] Patent Number: 5,502,326

[45] Date of Patent: Mar. 26, 1996

[54] SEMICONDUCTOR DEVICE PROVIDED HAVING A PROGRAMMABLE ELEMENT WITH A HIGH-CONDUCTIVITY BURIED CONTACT REGION

[75] Inventors: Jan W. Slotboom; Pierre H. Woerlee; Reinout Woltjer, all of Eindhoven, Netherlands

[73] Assignee: U.S. Philips Corporation, New York, N.Y.

[21] Appl. No.: 381,002

[22] Filed: Jan. 25, 1995

Related U.S. Application Data

[63] Continuation of Ser. No. 154,683, Nov. 18, 1993, abandoned.

[30] Foreign Application Priority Data

Nov. 20, 1992 [EP] European Pat. Off. ............ 92203576

[51] Int. Cl.$^6$ .................... H01L 29/00; H01L 27/095; H01L 27/10
[52] U.S. Cl. .................... 257/530; 257/209; 257/476; 257/910
[58] Field of Search ................... 257/530, 209, 257/476, 910; 365/96

[56] References Cited

U.S. PATENT DOCUMENTS

| | | | |
|---|---|---|---|
| 4,692,787 | 9/1987 | Possley et al. | 257/530 |
| 4,881,114 | 11/1989 | Mohsen et al. | 357/54 |
| 4,914,055 | 4/1990 | Gordon et al. | 257/530 |
| 4,933,735 | 6/1990 | Potash et al. | 257/530 |
| 5,126,290 | 6/1992 | Lowrey et al. | 437/235 |
| 5,298,784 | 3/1994 | Gambino | 257/530 |

FOREIGN PATENT DOCUMENTS

| | | |
|---|---|---|
| 0216246 | 4/1987 | European Pat. Off. . |
| 60-74669 | 4/1985 | Japan . |

*Primary Examiner*—Ngân V. Ngô
*Attorney, Agent, or Firm*—Steven R. Biren

[57] ABSTRACT

A semiconductor device includes a programmable element having a doped semiconductor region (4) and a conductor region (6) which are separated from one another by at least a portion of an insulating layer (5). The conductor region (6) is of a material suitable for forming a rectifying junction (8) with the material of the semiconductor region (4). To achieve a comparatively high conductivity connection to the semiconductor region (4), the element is further provided with a contact region (3) which has a comparatively low electrical resistance compared with the semiconductor region (4). The contact region (3) is provided at a side of the semiconductor region (4) remote from the insulating layer (5) and is separated from the insulating layer (5) by the semiconductor region (4). Both the semiconductor region (4) and the contact region (5) are laterally bounded by an isolating region (7) at opposing sides. The invention thus offers a device provided with a programmable element of a substantially more compact structure than a comparable conventional programmable element.

12 Claims, 2 Drawing Sheets

SEMICONDUCTOR DEVICE PROVIDED HAVING A PROGRAMMABLE ELEMENT WITH A HIGH-CONDUCTIVITY BURIED CONTACT REGION

This is a continuation of application Ser. No. 08/154,683, filed Nov. 18, 1993 now abandoned.

BACKGROUND OF THE INVENTION

The invention relates to a semiconductor device with a programmable element comprising a doped semiconductor region and a conductor region which are separated from one another by at least a portion of an insulating layer, the conductor region comprising a material which is suitable for forming a rectifying junction with the material of the semiconductor region, the programmable element being provided with a contact region which adjoins the semiconductor region and which has a comparatively low electrical resistivity compared therewith.

The invention in particular relates to a semiconductor device in which such a programmable element forms part of an electrically programmable memory cell which is arranged in a matrix of a number of similar memory cells.

Such a semiconductor device is known from U.S. Pat. No. 4,881,114, where the programmable element is used in a programmable memory cell. The known programmable element comprises a semiconductor region in the form of a boron-doped p-type surface zone which is situated in an n-type substrate of monocrystalline silicon. The conductor region of the known element is formed by a portion of a comparatively heavily n-type doped polycrystalline silicon layer which is separated from the p-type surface zone by a triple insulating layer of silicon oxide, silicon nitride and silicon oxide in that order.

The element can be programmed in that a voltage difference is applied between the semiconductor region and the conductor region to such a value that the insulating layer breaks down at least locally. Where the insulating layer shows breakdown, the p-type silicon of the semiconductor region and the n-type silicon of the conductor region come into mutual contact, thus forming a rectifying pn junction. In this state, the element has a comparatively low resistance at least in the forward direction of the pn junction, in contrast to the unprogrammed state in which the element is non-conducting.

For the purpose of electrically connecting the semiconductor region, the programmable element is provided with a contact region which has a substantially lower electrical resistance than the semiconductor region itself. The contact region in the known device comprises a surface zone which is comparatively heavily p⁺-type doped and which adjoins the semiconductor region.

The contact region does provide a comparatively good conductive connection to the memory element, but it requires additional surface area in the known device, which is to the detriment of the packing density and renders the known memory cell in particular less suitable for large-scale integration.

SUMMARY OF THE INVENTION

The invention has for its object to provide a semiconductor device of the kind mentioned in the opening paragraph for which only a relatively small surface area at the semiconductor surface is required.

According to the invention, a semiconductor device of the kind mentioned in the opening paragraph is characterized in that the contact region is provided at a side of the semiconductor region remote from the insulating layer and is separated from the insulating layer by the semiconductor region, and in that both the semiconductor region and the contact region are laterally bounded by an insulation region at mutually opposing sides.

In the device according to the invention, accordingly, the contact region is vertically integrated with the semiconductor region. As a result, it does not occupy any space in the lateral direction, so that no additional chip surface area is required for the contact region. The space required for the programmable element may thus be limited to the surface area of the semiconductor region alone, and thus to the minimum lithographic dimension, i.e. the dimensions of the smallest detail which can still be adequately pictured without problems, given a certain lithography. For a minimum lithographic dimension l, according to the invention, no more than $l^2$ space is required for the programmable element.

A special embodiment of the device according to the invention is characterized in that both the semiconductor region and the contact region form part of a first strip-shaped conductor track which is laterally bounded by the insulation region and in that the conductor region forms part of a second strip-shaped conductor track which extends transverse to the direction of the first conductor track. The programmable element in this embodiment is situated at the overlap of the two conductor tracks. The surface area required for this is equal to the product of the widths of the two conductor tracks. Both widths can be reduced to the minimum lithographic dimension l, so that the programmable element itself requires no more than $l^2$ space. The conductor tracks may serve, for example, as selection lines, i.e. as word and bit lines by means of which the programmable element may be addressed so as to be read or programmed.

It is noted in this connection that, wherever a conductor is referred to in the present application, within the scope of the invention this should be understood to mean any material capable of conducting an electric current. This definition in particular comprises not only metals, metal alloys and metal compounds, but also semiconductor materials.

The insulation region which bounds the semiconductor region may comprise, for example, an oxide region which was obtained through local oxidation of semiconductor material. A preferred embodiment of the invention, however, is characterized in that the insulation region comprises a groove which bounds the semiconductor region laterally and which is coated with at least an insulating layer. In particular when the semiconductor body comprises a number of similar programmable elements, a much higher packing density can be realized by means of groove insulation than by means of an insulation region obtained through local oxidation. The mutual interspacing between elements is in fact determined not only by the lithographic and technological accuracy, but also, and indeed in the case of high packing densities even mainly by the minimum length of the current path between adjoining elements which is necessary for avoiding breakdown effects, especially latch-up, between adjoining elements. This length is often greater than the minimum lithographic dimension especially in modern semiconductor processes. When groove insulation is used according to the invention, it is achieved that the current path between adjoining elements extends for a comparatively major part in the depth direction without requiring additional space for this purpose in lateral direction. The lateral distance between adjoining elements can thus remain limited to the minimum lithographic dimension, so that a very high packing density can be realized. The width-depth ratio of an insulation region formed by local oxidation is in general too great for achieving the same packing density.

The desired groove insulation may be formed, for example, through local removal of material from an otherwise continuous semiconductor layer, for example through etching, in which case the layer itself may be used for forming the semiconductor region. The insulation region and the semiconductor region are thus automatically aligned relative to one another, so that a mutual alignment step is avoided. In addition, removal techniques with an anisotropic action known per se may be used for etching of the groove, so that a lateral extension of the insulation region can be restricted to a minimum. The lateral dimension of the insulation region in that case is substantially entirely determined by the lithography used and may thus be reduced to the minimum lithographical dimension l. In this preferred embodiment, the memory cell according to the invention including the accompanying insulation region does not require more than $4l^2$ surface area. This is considerably less than the surface area needed for the known programmable element.

Furthermore, this preferred embodiment leads to a comparatively simple structure, at least as far as the programmable element is concerned. As a result, the device is particularly suitable for use of m-called phase shifting techniques which are known per se in present-day lithography and by which details can be pictured of approximately half the size of what would otherwise be possible. The use of such a technique renders it possible to reduce the surface area required for a programmable memory cell including the accompanying insulation region to $l^2$, which is an order of magnitude smaller than the total surface area required for the known memory cell including its insulation region.

This means, for example, that in modern optical lithography with a minimum lithographic dimension l of 0.5 μm with the use of phase shifting techniques a memory cell can be realized on a surface area of no more than 0.25 μm$^2$ in the device according to the invention. Thus some 400 million memory cells per cm$^2$ chip surface can be integrated in the device according to the invention. This corresponds to an information density of 400 Mbit/cm$^2$, which is an order of magnitude higher than what can be achieved in known memories using the same lithography. The invention is accordingly extremely suitable for applications in which a very large memory capacity is required such as, for example, as an audio and/or video memory or as a memory in computer equipment.

Smaller details can be pictured and the integration may be increased even further in that illumination is carried out not with visible light but with radiation of a shorter wavelength such as, for example, UV radiation and X-ray radiation, or electron radiation.

The construction of the programmable element according to the invention is comparatively simple, and accordingly comparatively simple process steps are required for its manufacture, which steps may in addition be carried out in a comparatively late stage of a conventional semiconductor manufacturing process. This renders it possible in particular to provide the element only after a semiconductor switching element has been formed in a semiconductor body, and to place the programmable element on the switching element, separated therefrom by a dielectric intermediate layer. In this manner, for example, any control electronics of the element can be integrated below the cell, so that no additional chip surface area is required for that purpose.

BRIEF DESCRIPTION OF THE DRAWING

The invention will now be explained in more detail with reference to several embodiments and the drawing, in which.

Figure 1A:
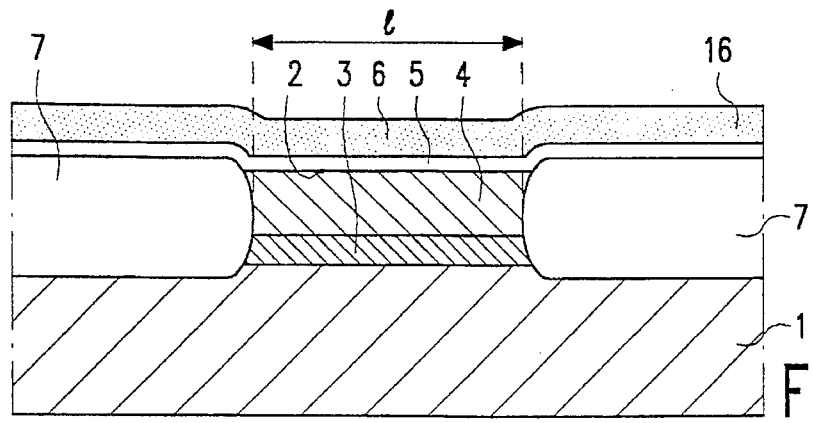
FIG. 1A is a cross-section of a first embodiment of the semiconductor device according to the invention comprising a programmable memory cell.

The Figures are purely diagrammatic and not drawn to scale. Some dimensions in particular are shown strongly enlarged for the sake of clarity. Semiconductor regions of the same conductivity type are hatched in the same direction as much as possible, and corresponding parts are given the same reference numerals.

DESCRIPTION OF THE PREFERRED EMBODIMENTS

In a first embodiment, the programmable element according to the invention is used in a memory cell which is integrated into a silicon semiconductor body with an n-type surface region 1, see FIG. 1A. The element comprises a semiconductor region in the form of a boron-doped p-type semiconductor zone 4 which is situated in the surface region 1 and adjoins the surface 2 of the semiconductor body. The p-type surface zone 4 is separated from a conductor region 6 by an approximately 8 nm thick insulating layer 5 of silicon oxide. The conductor region 6 in this embodiment comprises n-type silicon and forms part of a comparatively heavily doped polycrystalline layer 16. Instead of silicon of a doping type opposite to that of the surface zone 4, a Schottky metal which is suitable for forming a rectifying Schottky junction with the silicon of the surface zone 4, may alternatively be used for the layer 16 and the conductor region 6, if so desired. The comparatively low resistivity of the layer 16 in that case ensures a comparatively low-ohmic connection to the conductor region 6.

The memory cell is further provided with a contact region which, according to the invention, is applied to the side of the p-type surface zone 4 remote from the insulating layer 5. The contact region is formed by a comparatively heavily p-type doped buried zone 3. Both the surface zone 4 and the buried zone 3 are bounded by an insulating region 7 at opposing sides according to the invention. The insulating region 7 comprises a silicon oxide region which is partly recessed into the semiconductor body 1 and which was obtained through local oxidation (LOCOS) of the semiconductor body.

The contact region 3 is provided below the surface zone 4 through an implantation with ions comprising boron after the formation of the insulating region 7. A comparatively large dose and a comparatively high implantation energy of $10^{15}$ ions/cm$^2$ and 200 keV, respectively, were used during this treatment. The insulating region 7, however, is sufficiently thick for forming an effective mask against the implantation of the contact region 3. The contact region 3 is thus formed automatically in the correct spot.

Because of the comparatively heavy dose, the contact region 3 has a comparatively high doping concentration and thus a comparatively low sheet resistance compared with the surface zone 4. The contact region 3 accordingly provides a sufficiently low-ohmic connection to the semiconductor region 4.

In accordance with the invention, the memory cell within the oxide region 7 does not require more space than does the surface zone 4 on its own. The width thereof was made as small as possible in the present example, for a given lithography, so that it is equal to the minimum lithographic dimension l of 0.5 μm. The same holds for the width of the conductor region 6. The present memory cell itself accordingly does not occupy more than 0.25 μm² chip surface area. This is considerably less than what is required for a conventional memory cell, given the same lithography.

Figure 1B:
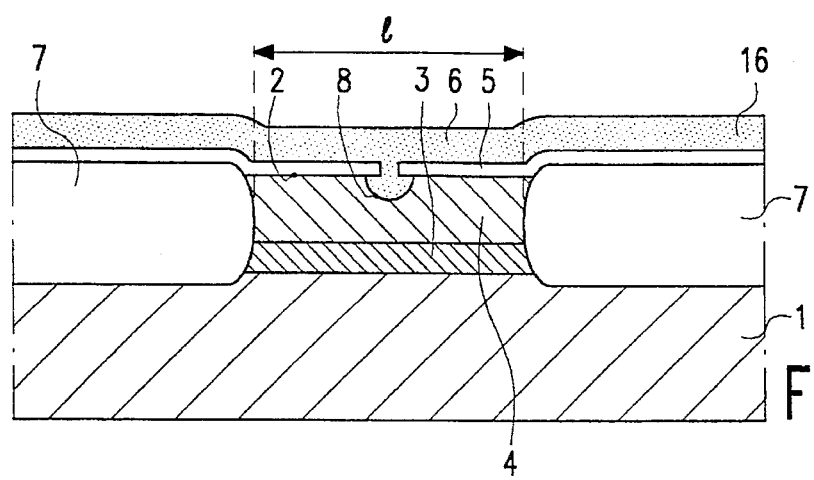
FIG. 1B shows the device of FIG. 1A with a memory cell after programming.

The memory element is programmed in that a short pulse is applied between the p-type surface zone 4 and the silicon layer 6 of a sufficiently high voltage for causing an electric breakdown at least locally in the interposed silicon oxide layer 5. FIG. 1B shows the memory cell in the programmed state. The n-type silicon of the conductor region 6 and the p-type silicon of the semiconductor region 4 come into mutual contact where the oxide layer 5 was punctured, and a rectifying pn junction 8 is formed. It should be noted in this connection that, although the rectifying junction 8 is drawn exclusively in the surface zone 4, it is possible in practice for material of the semiconductor region 4 to penetrate through the opening in the insulating layer 5 into the conductor layer 6. In that case the rectifying junction will lie at least also in the conductor region 6 after programming.

A negative programming voltage is preferably applied to the silicon layer 6 relative to the p-type surface zone 4 during programming. In that case, an accumulation layer is induced into the surface zone 4 at the surface, i.e. a layer having an increased density of free charge carriers, whereby the programming voltage will be present entirely across the oxide layer 5. This means that a lower programming voltage can suffice compared with the situation in which an opposite polarity were applied, whereby free charge carriers would indeed be driven away from the surface and the programming voltage would partly occur across the depletion region generated thereby. In the present example, a programming voltage of −12 V is found to be sufficient for programming the cell. If the semiconductor region 4 were oppositely doped, i.e. n-type, the same would apply mutatis mutandis. In that case, the polarity of the programming voltage is adapted accordingly and a positive voltage difference of the conductor region 6 relative to the semiconductor region 4 is preferably applied. The doping concentration in the polycrystalline silicon layer 16, 6 is so high that no depletion region of any importance is created therein.

Included in a matrix, the memory cell may be selected for programming in that the silicon layer 16 is used as a first selection line and a programming voltage of −12 V is applied thereto relative to the contact region 3 which may be used as a second selection line, and in that an opposite voltage difference is applied between each corresponding first and second selection line of the remaining selection lines of the matrix. In that case, exclusively the desired cell is programmed because only in that cell 12 V will actually be across the insulating layer 5. In non-selected non-programmed cells, across which the programming voltage will be applied with opposite polarity, indeed, a portion of the programming voltage will be present across the depletion region induced into the surface zone 4 in that case.

It is possible in this method of addressing for the offered programming voltage to fall across the pn junction 8 formed therein as a reverse bias voltage in a cell which has been programmed. This means that the breakdown voltage of the pn junction 8 must be greater than the programming voltage used. Since the series resistance of the cell is mainly determined by the comparatively well-conducting contact region 3 and the also comparatively well-conducting silicon layer 16, and is influenced only to a slight degree by the specific doping concentration of the comparatively short semiconductor region 4, the doping concentration of the semiconductor region 4 may be freely adapted so as to comply with this requirement without the total series resistance of the element being excessively increased. In the present example, a boron concentration of approximately $10^{16}$ cm$^{-3}$ is used for the surface zone 4, so that the breakdown voltage of the junction 8 formed is amply sufficient for withstanding the programming voltage of 12 V.

Figure 2A:
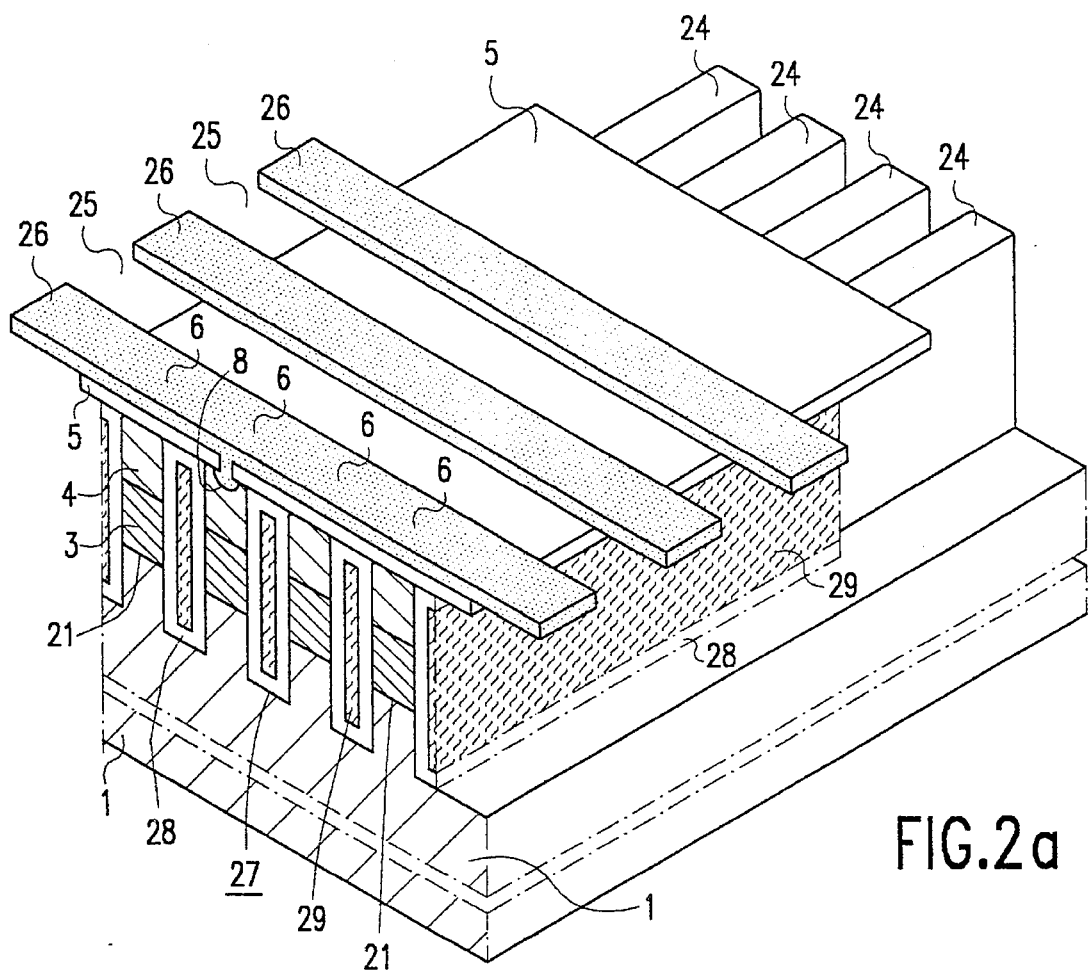
FIG. 2A is a perspective view of a second embodiment of the semiconductor device according to the invention.
Figure 2B:
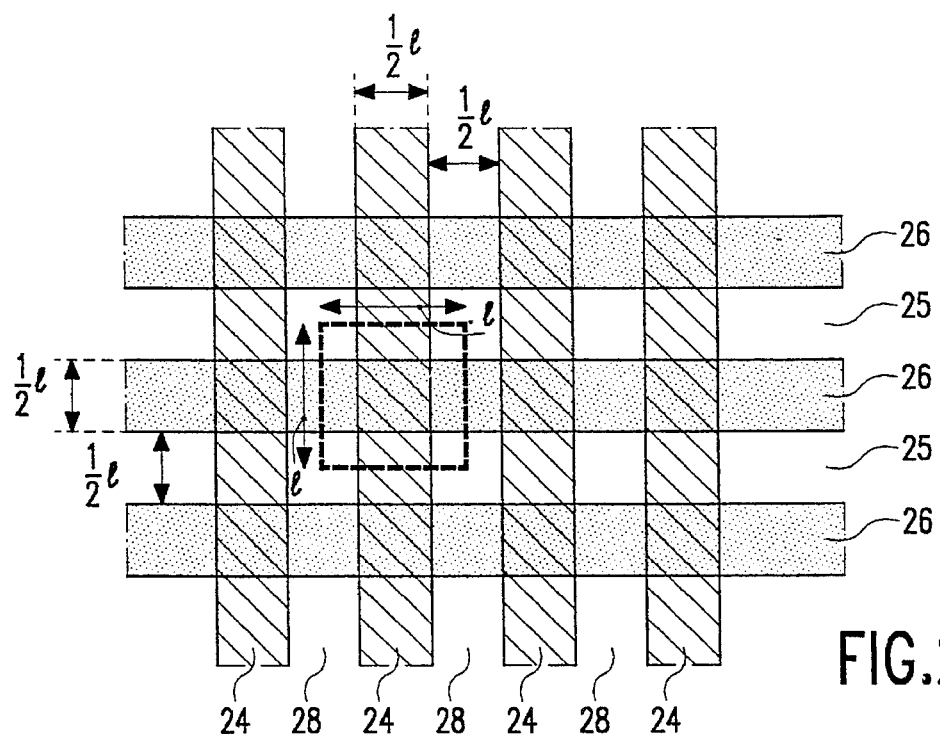
FIG. 2B is a plan view of the device of FIG. 2A.

A second embodiment of the device according to the invention is shown in perspective view in FIG. 2A. FIG. 2B is a plan view of the same device. A number of insulating layers which usually cover and passivate the device have been left out in both Figures for the sake of clarity.

In this embodiment, the device comprises a matrix of memory cells, which matrix is formed by a number (n) of parallel first strip-shaped conductor tracks 24 which extend in a first direction and of which four have been depicted, and by a number (m) of parallel second strip-shaped conductor tracks 26 which extend in a second direction transverse to the direction of the first conductor tracks and of which three are shown in the Figure. Both the first and the second conductor tracks in this embodiment are formed by semiconductor tracks of silicon. The first conductor tracks 24 are of monocrystalline structure and are p-type doped with boron. The second conductor tracks 26 on the other hand comprise polycrystalline silicon and are oppositely, i.e. n-type, doped with arsenic. The two kinds of conductor tracks 24, 26 are separated from one another by an insulating layer 5 in the form of an approximately 10 nm thick so-called ONO layer of, in that order, approximately 2 nm silicon oxide, approximately 6 nm silicon nitride, and approximately 2 nm silicon oxide.

The p-type first conductor tracks 24 are provided on an n-type type silicon substrate 1 and each form a pn junction 21 therewith. The pn junctions are reverse biased during operation and ensure an adequate electrical isolation of the conductor tracks 24 relative to the substrate 1 and relative to one another.

The first conductor tracks 24 are laterally bounded by strip-shaped insulating regions 27 in the form of longitudinal grooves whose walls are coated with an insulating layer 28 of silicon oxide. The grooves 27 are filled up further with a suitable filler 29 in a manner known per se. In this embodiment the grooves 27 are filled with polycrystalline silicon, which is subsequently covered with silicon oxide by means of a short oxidation step.

The memory elements of the memory cells are present at the areas where a second conductor track 26 crosses a first conductor track 24. The second conductor tracks 26 constitute n-type silicon conductor regions 6 of the memory elements, and the first conductor tracks 24 constitute associated semiconductor regions 4 of p-type silicon. Below the semiconductor regions 4 there are comparatively heavily doped contact regions 3 in the form of p-type buried layers which ensure a sufficiently low-ohmic connection to the respective semiconductor regions 4.

The first conductor tracks 24 are manufactured from a p-type silicon layer which was grown epitaxially on the n-type substrate 1. The doping required for the layer is added during or after growth. Previously, the n-type substrate 1 was heavily p-type doped at its surface in order that a comparatively heavily doped p-type buried layer is created at the interface between the substrate and the epitaxial layer, which buried layer forms the contact regions 3.

After the epitaxial growth, the formed silicon layer is provided with the grooves 27 at the surface 2 by locally etching the layer using a suitable mask. The grooves 27 are etched up to and into the substrate 1 so as to ensure a good lateral isolation of adjoining conductor tracks 24. No alignment step with the accompanying alignment tolerances is required in this manner between the first conductor tracks 24 on the one hand and the insulating region 27 on the other hand, which saves space. The grooves are covered in a manner known per se with the dielectric layer 28 and filled with polycrystalline silicon 29. The groove may be opened at the bottom before filling. In that case the filler is connected to the substrate in the final device, so that it is prevented that the filler could act as a floating capacitor plate during operation and thus adversely affect the operation of the device.

Anisotropic etching of the grooves 27 reduces the lateral dimension thereof to a minimum, so that also the smallest possible chip surface area is lost thereby. For this purpose, for example, an anisotropically operating plasma which is known per se is used as the etchant. The width of both the first conductor tracks 24 and the grooves 27 is thus determined substantially only by the etching mask used, and thus depends only on the accuracy of the lithography used. In the present example, a lithography with a minimum lithographical dimension of 0.5 µm and including phase-shifting techniques is used, and the width of the grooves and the conductor tracks is no more than approximately 0.25 µm. The depth of the grooves, however, is more than 1 µm, so that the length of the current path between adjoining cells is sufficiently great for avoiding breakdown between adjoining cells in spite of the small groove width.

The second conductor tracks 26 are manufactured in an analogous manner from a continuous n-type polycrystalline silicon layer which is provided over the entire surface and is subsequently etched into a pattern with an anisotropic etchant. As a result, again, the second conductor tracks and the grooves 25 separating the second conductor tracks 26 from one another have a width which is determined substantially exclusively by the etching mask used. The first conductor tracks 24 and the second conductor tracks 26 form the word lines and bit lines of the memory matrix.

A lithography was used in the present example with an accuracy of 0.5 µm, while in addition phase-shifting techniques were used such as described, for example, in an article by M. D. Levenson in *Microlithography World*, September/October 1992, pp. 6–12, entitled "Phase-Shifting Mask Strategies: Line-Space Patterns", the contents of which is deemed to be incorporated with the present description by reference. Such techniques are particularly suitable for comparatively simple structures such as that of the present memory matrix which comprises substantially only a number of continuous tracks. As a result, the widths of the various conductor tracks 24, 26 and grooves 25, 27 can be constructed to be smaller by approximately a factor two than the minimum lithographical dimension 1 of 0.5 µm associated with the lithography used. In this example, accordingly, the said widths are equal to 1/2 or 0.25 µm. Even smaller dimensions can be achieved with advanced optical lithography or with imaging techniques which use radiation of a shorter wavelength than visible light such as, for example, UV, X-ray and electron lithography.

As is shown in plan view in FIG. 2B, a memory cell including the associated insulation can be realized on a chip area of no more than $1^2$, or 0.25 µm$^2$, in the present embodiment. The memory element proper 4, 5, 6 then occupies no more than $1^2/4$. This is an order of magnitude less than the area required for the known memory cell. As a result, the invention realizes an information density of approximately 400 Mbit/cm$^2$ in the case of 0.5 µm lithography and is thereby extremely—though not exclusively—suitable for applications in which such a large non-volatile memory capacity is desired such as, in addition to many computer applications, for example, also in audio and/or video memories. Thus, for example, the memory contents of a conventional Compact Disc (CD) with an hour of digital stereo music information can be stored on less than 2 cm$^2$ in the device according to the present invention, using data compression techniques known per se. The invention has the additional advantage that the memory can be read fully electronically, so that no moving parts which require space and energy and are comparatively prone to failure are required. For ease of handling and for the possible display of information relating to the music and/or images stored, the device may be constructed, for example, as a chip card.

Figure 3:
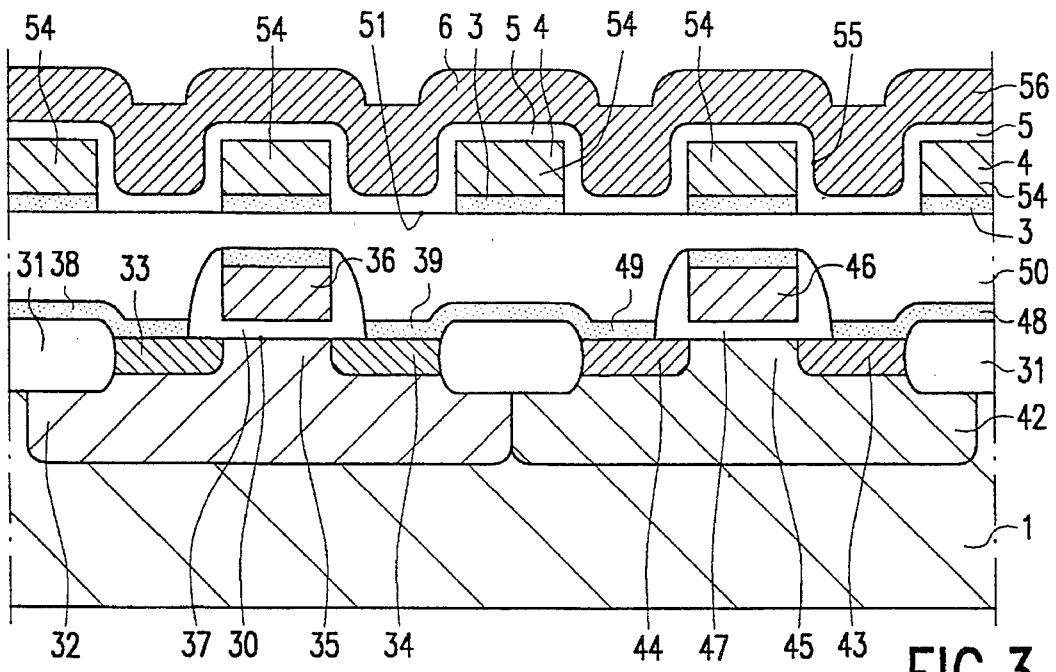
FIG. 3 is a cross-section of a third embodiment of the device according to the invention.

A third embodiment of the device according to the invention is shown in FIG. 3. This embodiment starting material is a comparatively lightly doped p-type silicon substrate 1 which is provided with a partly recessed silicon oxide pattern 31 at the surface 30 by means of local oxidation. The oxide pattern 31 encloses two islands 32, 42 which are doped somewhat more heavily than the substrate 1, n-type and p-type, respectively, by means of ion implantation.

A PMOS transistor is present at the surface 30 in the n-type island 32 with a comparatively heavily doped p-type source zone 33 and drain zone 34 which are mutually separated by a portion of the n-type island 32, which portion forms a channel region 35 of the transistor. The transistor further comprises a gate electrode 36 which is separated from the channel region 35 by a comparatively thin gate dielectric 37 of silicon oxide. The gate electrode 36 comprises n-type polycrystalline silicon and is coated with titanium silicide which is electrically comparatively well-conducting as compared with the polycrystalline silicon, and which thus reduces the electrical resistance of the gate electrode 36. The electrical conductance of the channel region 35 can be modulated by means of the gate electrode 36. The source zone 33 and drain zone 34 are provided with a source electrode 38 and a drain electrode 39, respectively, of titanium silicide as electrical connections.

The p-type island 42 in an analogous manner comprises an NMOS transistor with a comparatively heavily doped n-type source zone 43 and drain zone 44 which are mutually separated by a p-type channel region 45. The channel region 45 is covered in that order with a comparatively thin gate dielectric 47 of silicon oxide and a gate electrode 46 of n-type silicon by means of which the conductance in the channel region 45 can be controlled. To achieve a lower electrical resistance, the gate electrode 46 is provided with a comparatively highly conductive top layer of titanium silicide. The source and drain zones 43, 44 are provided with highly conductive source and drain electrodes 48, 49, respectively, of titanium silicide. The drain electrodes 39, 49 of the two transistors are integral.

The source and drain electrodes 38, 48, 39, 49 and the top layers of the gate electrodes 36, 46 of the two transistors are provided in one and the same process step. Instead of titanium silicide, indeed, other silicides, for example, cobalt silicide and platinum silicide, may be used, or possibly a metal such as, for example, titanium-tungsten and aluminium, may be used.

The entire assembly is coated with an approximately 0.5–1 μm thick dielectric intermediate layer 50, in the present case of flow glass (BPSG) which has a substantially plane surface 51 in spite of the subjacent structure. Such a plane surface 51 may be obtained in that the assembly is heated to a temperature of approximately 900° C. after the layer 50 was provided, whereby the layer 50 flows and smoothes itself out. In principle, alternative glass types including pure silicon oxide may also be used for this purpose. However, these have the disadvantage that the softening temperatures of these materials are substantially higher. Alternatively, an insulating layer may be applied which, thereafter is planarized in a known manner, for instance by applying photoresist and etch-back.

The dielectric intermediate layer 50 separates a matrix of memory cells from the subjacent substrate 1 with the transistors present therein. In this way the transistors forming part of the electronics by which the memory cells can be controlled during operation can be integrated below the memory matrix, so that no or hardly any additional space is required for the control. The control electronics are coupled to the memory matrix through openings in the intermediate layer 50.

The matrix is formed by a number (n) of mutually parallel first conductor tracks 54 which comprise a top layer of p-type silicon, and a number (m) of mutually parallel second conductor tracks 56 of n-type silicon. In FIG. 3 four tracks 54 and one track 56 are shown. The first conductor tracks 54 lie on the dielectric intermediate layer 50 which isolates the conductor tracks 54 from the subjacent substrate 1 and the transistors present therein. The second conductor tracks 56 cross the first conductor tracks 54 in a direction transverse thereto and are separate from the first conductor tracks 54 by an approximately 8 nm thick insulating layer 5 of, in that order, approximately 6 nm silicon nitride and approximately 2 nm silicon oxide. Wherever a first conductor track 54 and a second conductor track 56 overlap, there is a memory element comprising a semiconductor region 4 of p-type silicon forming part of the relevant first conductor track 54 and a conductor region 6 of n-type silicon formed by the relevant second conductor track 56. The memory cells, furthermore, are each provided with a contact region 3 of tungsten silicide which lies in the first conductor track 54 below the semiconductor region 4.

The memory matrix according to the invention is of a comparatively simple construction and may be provided in a comparatively late stage in the manufacturing process. In addition, the device is compatible with many kinds of semiconductor processes, i.e. besides in a CMOS process as in the present example, for example, also in uni-channel MOS processes and in bipolar processes.

In the present example, the memory matrix is not provided until after the transistors have been formed and the dielectric intermediate layer 50 has been provided. For this purpose, a conductive layer for the contact regions 3 and a p-type doped silicon layer, for example in polycrystalline form, are deposited in that order on the dielectric intermediate layer 50, after which the two layers are etched into a pattern so as to shape the first conductor tracks 54. The layers between the tracks 54 to be formed are removed down to the dielectric intermediate layer 50 during this. The grooves 55 thus formed extend down to the dielectric intermediate layer 50 and thus form an isolation region comparable to region 7 of FIG. 1 which isolation region bounds both the semiconductor regions 4 and the subjacent contact regions 3 at opposing sides, thus ensuring a good mutual isolation of the first conductor tracks 54.

After the first conductor tracks 54 have been provided, the assembly is covered in that order with a layer of silicon nitride and a layer of silicon oxide which serve as a dielectric 5 for the memory elements to be formed, and in addition coat the grooves 55 situated between the first conductor tracks 54. On the insulating layer is then provided an n-type silicon layer from which the second conductor tracks 56 are etched. In this embodiment, again, a 0.5 μm lithography is used at least for forming the memory matrix in conjunction with phase-shifting techniques, so that the memory elements 4, 5, 6 including the associated portions of the insulating region 7, 55 occupy no more than approximately 0.25 μm$^2$ chip area.

Although the invention was described above with reference to only a few embodiments, it will be apparent that the invention is by no means limited to the examples given. Many more variations are possible to those skilled in the art within the scope of the invention. Thus the conductivity types mentioned for the semiconductor materials used may be replaced, all simultaneously, by the opposite conductivity types, and the materials used may be replaced by alternative materials.

The programmable element may be used not only in a memory cell, but also, for example, as a programmable logic switch. Furthermore, the rectifying junction formed after programming may form part of a kind of semiconductor switching element different from a diode. In particular, the rectifying junction may form, for example, the emitter-base junction of a bipolar transistor. The transistor may be formed selectively in this manner.

The device according to the invention may be provided on any suitable substrate. In particular, it is possible to start with a substrate comprising a semiconductor body with a (monocrystalline) top layer of semiconductor material which is separated from the rest of the semiconductor body by a dielectric intermediate layer. Such a structure is usually called SOI (Silicon On Insulator). In that case, the conductor region or the semiconductor region of the programmable element may be formed from the top layer, for example, and the isolating region preferably extends down to the dielectric intermediate layer.

In addition, it is possible to start with a fully dielectric substrate, for example, made of glass, in which case thin-film transistors may be used for the control function.

In general, the invention provides a semiconductor device in which a programmable element can be integrated with an extremely high packing density.

We claim:

1. A semiconductor device with a semiconductor body and a programmable memory element comprising a doped semiconductor region and a conductor region which are everywhere separated from one another in the unprogrammed state by at least a portion of an insulating layer, the conductor region comprising a material which is suitable for forming a rectifying junction with the material of the doped semiconductor region, said rectifying junction being formed in the programmed state, the programmable memory element comprising a contact region which contacts the doped semiconductor region and the semiconductor body, and said contact region has a comparatively low electrical resistivity compared to that of said doped semiconductor region, characterized in that the contact region is provided at a side of the doped semiconductor region remote from the insulating layer and is separated from the insulating layer by the doped semiconductor region, in that the doped semiconductor region and the contact region form a narrow vertical stack, and in that both the doped semiconductor region and the contact region are laterally bounded by a narrow dielectric isolation region at mutually opposing sides, said narrow dielectric isolation region extending to a greater depth in said semiconductor body than that of said contact region.

2. A semiconductor device as claimed in claim 1, characterized in that the isolation region comprises a groove which bounds the semiconductor region and the contact region laterally and which is coated with at least an insulating layer.

3. A semiconductor device as claimed in claim 2, characterized in that the groove is filled up with a suitable filler.

4. A semiconductor device as claimed in any one of the claim 1, characterized in that both the semiconductor region and the contact region form part of a first strip-shaped conductor track which is laterally bounded by the isolation region and in that the conductor region forms part of a second strip-shaped conductor track which extends transverse to the direction of the first conductor track.

5. A semiconductor device as claimed in claim 4, characterized in that the first conductor track is formed by a first semiconductor track of a first conductivity type, and in that the contact region comprises a comparatively heavily doped buried semiconductor zone of the first conductivity type.

6. A semiconductor device as claimed in claim 5, characterized in that the second conductor track comprises a second semiconductor track of a second, opposite conductivity type which is provided over the first semiconductor track.

7. A semiconductor device as claimed in claim 5, characterized in that the second conductor track comprises a material which is suitable for forming a rectifying Schottky junction with the first conductor track.

8. A semiconductor device as claimed in claim 5, characterized in that the first semiconductor track is situated on a semiconductor substrate, in that the first conductor track forms a pn junction at least with a surface region of the semiconductor substrate, which pn junction is reverse biased during operation, and in that the isolating region which laterally bounds the first conductor track extends at least up to the surface region.

9. A semiconductor device as claimed in claim 4, characterized in that the first conductor track is provided on a dielectric intermediate layer which separates the first conductor track from a subjacent semiconductor substrate, and in that the isolating region which laterally bounds the first conductor track extends down to the dielectric intermediate layer.

10. A semiconductor device as claimed in claim 9, characterized in that the first conductor track is formed by a composite layer comprising a bottom layer containing metal which adjoins the dielectric intermediate layer and of which the contact region forms part, and comprising a top layer of semiconductor material which adjoins the insulating layer and of which the semiconductor region forms part.

11. A semiconductor device provided with a matrix of memory cells which each comprise a programmable element as claimed in claim 1, characterized in that the matrix is composed of a number (n) of parallel first conductor tracks which extend in a first direction and by a number (m) of parallel second conductor tracks which extend in a second direction transverse to the first direction, in that the first conductor tracks are laterally bounded by strip-shaped isolating regions, and in that the first conductor tracks and the second conductor tracks are separated from one another by the insulating layer.

12. A semiconductor device as claimed in claim 11, characterized in that the matrix is separated from a subjacent semiconductor body by a dielectric intermediate layer, and in that at least a semiconductor switching element is provided below the matrix in the semiconductor body.

\* \* \* \* \*